United States Patent
Cho et al.

(10) Patent No.: US 10,732,744 B2
(45) Date of Patent: Aug. 4, 2020

(54) DISPLAY DEVICE INCLUDING TOUCH SENSOR

(71) Applicant: Samsung Display Co., Ltd., Yongin, Gyeonggi-do (KR)

(72) Inventors: Hyun-Wook Cho, Cheonan-si (KR); Sang Kook Kim, Cheonan-si (KR); Tae Joon Kim, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 239 days.

(21) Appl. No.: 14/266,530

(22) Filed: Apr. 30, 2014

(65) Prior Publication Data

US 2015/0145808 A1 May 28, 2015

(30) Foreign Application Priority Data

Nov. 28, 2013 (KR) ........................ 10-2013-0146083

(51) Int. Cl.
    *G06F 3/041* (2006.01)
    *H01L 27/32* (2006.01)
    *G06F 3/044* (2006.01)

(52) U.S. Cl.
    CPC ............ *G06F 3/0412* (2013.01); *G06F 3/044* (2013.01); *H01L 27/323* (2013.01); *G06F 2203/04107* (2013.01); *G06F 2203/04111* (2013.01)

(58) Field of Classification Search
    CPC ... G06F 2203/0417; G06F 2203/04107; G06F 2203/04111; G06F 3/0412; G06F 3/044; H01L 27/323
    See application file for complete search history.

(56) References Cited

U.S. PATENT DOCUMENTS

| | | | | |
|---|---|---|---|---|
| 2005/0001944 A1* | 1/2005 | Wu | ................... | G02F 1/136209 349/44 |
| 2007/0171320 A1* | 7/2007 | Lin | ................... | G02F 1/136286 349/44 |
| 2007/0278551 A1* | 12/2007 | Anthony | ............. | H01L 23/5223 257/307 |
| 2010/0019998 A1* | 1/2010 | You | ................... | G02F 1/133707 345/87 |
| 2011/0187677 A1* | 8/2011 | Hotelling | ............... | G06F 3/0412 345/174 |
| 2011/0279410 A1* | 11/2011 | Han | ........................ | G06F 3/044 345/174 |

(Continued)

FOREIGN PATENT DOCUMENTS

JP 2012-29310 A 2/2012
KR 10-2010-013197 A 12/2010

(Continued)

*Primary Examiner* — Dmitriy Bolotin
(74) *Attorney, Agent, or Firm* — Lewis Roca Rothgerber Christie LLP

(57) ABSTRACT

A display device including a touch sensor is disclosed. In one aspect, the display device includes a lower substrate and an upper substrate opposing each other and a first electrode, an electro-optical active layer, and a second electrode sequentially formed over the lower substrate. The display device also includes a plurality of touch electrodes formed below the upper substrate and over the second electrode and a shield layer interposed between the second electrode and the touch electrodes. The shield layer is formed at least partially of a conductive material.

15 Claims, 8 Drawing Sheets

(56) References Cited

U.S. PATENT DOCUMENTS

| | | | |
|---|---|---|---|
| 2012/0013544 A1* | 1/2012 | Philipp | G06F 3/041 345/173 |
| 2012/0327022 A1 | 12/2012 | Bytheway | |
| 2013/0016065 A1* | 1/2013 | Reynolds | G06F 3/0412 345/174 |
| 2013/0120310 A1* | 5/2013 | Siska | H03K 17/962 345/174 |
| 2013/0154961 A1 | 6/2013 | Wu et al. | |
| 2013/0285971 A1* | 10/2013 | Elias | G06F 3/044 345/174 |

FOREIGN PATENT DOCUMENTS

| | | |
|---|---|---|
| KR | 10-2011-0044670 A | 4/2011 |
| KR | 10-1040802 B1 | 6/2011 |
| KR | 10-2011-0081501 A | 7/2011 |
| KR | 10-2012-0015074 A | 2/2012 |

* cited by examiner

DISPLAY DEVICE INCLUDING TOUCH SENSOR

CROSS-REFERENCE TO RELATED APPLICATION

This application claims priority to and the benefit of Korean Patent Application No. 10-2013-0146083 filed on Nov. 28, 2013, the entire contents of which are incorporated herein by reference.

BACKGROUND

1. Field

The described technology generally relates to a display device, and more particularly, to a display device including a touch sensor.

2. Description of the Related Technology

Flat panel displays (FPDs) such as organic light-emitting diode (OLED) displays, liquid crystal displays (LCDs), and electrophoretic displays (EPDs) include a field generating electrode ad an electro-optical active layer. Various materials are used in forming the electro-optical active layer of the different FPDs. For example, OLED displays include an organic emission layer, LCDs include a liquid crystal layer, and EPDs include charged particles. The field generating electrode is connected to a switching element such as a thin film transistor (TFT) to receive a data signal and the electro-optical active layer converts the data signal to an optical signal to display an image.

Recently, FPDs including touch sensors have been developed. These touch sensors facilitate interaction with a user in addition to providing image display functionality. Touch sensors generate touch information such as whether an object is in contact with a screen and the touch location thereof by measuring a change in pressure applied to the screen, charge stored on a capacitors, received light, and the like, when a user touches a finger or a touch pen to the screen. The display device can alter the displayed images based on the touch information.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is a display device including a touch sensor having a reduced thickness.

Another aspect is a display device including a touch sensor having excellent signal sensitivity performance due to minimized parasitic capacitance.

Another aspect is a display device including a lower substrate and an upper substrate facing each other, a first electrode, an electro-optical active layer, and a second electrode on the lower substrate, a plurality of touch electrodes positioned below the upper substrate, and a shield layer positioned between the second electrode and the touch electrodes and including a conductive material.

The same signal may be applied to the shield layer and the touch electrodes.

The shield layer may be positioned below the touch electrodes with an insulating layer therebetween.

The shield layer may be made of a transparent conductive material.

The first electrode may be a pixel electrode and the second electrode may be a common electrode.

The plurality of touch electrodes may include a plurality of first touch electrodes and a plurality of second touch electrodes; one of the first touch electrode and the second touch electrode may be a sensing input electrode and the other electrode may be a sensing output electrode.

The same signal as the signal applied to any one of the sensing input electrode and the sensing output electrode may be applied to the shield layer.

The plurality of first touch electrodes and the plurality of second touch electrodes may be separated from each other and may not overlap with each other.

The plurality of first touch electrodes arranged in a first direction may be connected to each other by a plurality of first connectors and the plurality of second touch electrodes arranged in a second direction different from the first direction may be connected to each other by a plurality of second connectors.

The display device may further include an insulating layer positioned between the first connector and the second connector to insulate the first connector and the second connector.

The first connector may be positioned on the same layer as the first touch electrode and integrally formed with the first touch electrode.

The upper substrate may be made of glass.

A sealant may be positioned between the lower substrate and the upper substrate to connect the lower substrate and the upper substrate.

The electro-optical active layer may be a light-emitting member, the first electrode may be an anode, and the second electrode may be a cathode.

Another aspect is a display device including a lower substrate and an upper substrate opposing each other, a first electrode, an electro-optical active layer, and a second electrode sequentially formed over the lower substrate, a plurality of touch electrodes formed below the upper substrate and over the second electrode, and a shield layer interposed between the second electrode and the touch electrodes, wherein the shield layer is formed of a conductive material.

Each of the shield layer and at least one of the touch electrodes is configured to receive a driving signal. The display device further includes an insulating layer interposed between the shield layer and the touch electrodes. The shield layer is formed of a transparent conductive material. The first electrode is a pixel electrode and the second electrode is a common electrode. The touch electrodes include a plurality of first touch electrodes and a plurality of second touch electrodes, wherein either the first or second touch electrodes are sensing input electrodes, and wherein the other electrodes are sensing output electrodes. The sensing input electrodes are configured to receive the driving signal. The sensing output electrodes are configured to receive the driving signal.

The first and second touch electrodes are separated from each other and do not overlap with each other. The first touch electrodes are arranged in a first direction and electrically connected to each other via a plurality of first connectors and wherein the second touch electrodes are arranged in a second direction crossing the first direction and electrically connected to each other via a plurality of second connectors. The display device further includes an insulating layer interposed between the first and second connectors. The first connectors are formed on the same layer as the first touch electrodes and the first connectors are integrally formed with the first touch electrodes. The upper substrate is formed at least partially of glass. The display device further includes a sealant interposed between the lower and upper substrates to connect the lower substrate to the upper substrate. The electro-optical active layer comprises a light-emitting member, wherein the first electrode is an anode, and wherein the second electrode is a cathode.

Another aspect is a method of driving a display device comprising a substrate, a plurality of pixels formed over the substrate, and a shield layer interposed between the pixels and the touch electrodes, the method including driving each of the shield layer and at least one of the touch electrodes with a driving signal.

The shield layer is formed of a transparent conductive material. The display device further comprises an insulating layer interposed between the touch electrodes and the shield layer. The touch electrodes include a plurality of input electrodes and a plurality of output electrodes, wherein the input and output electrodes are spaced apart from each other, and wherein the driving includes applying the driving signal to the input electrodes and the shield layer. The input electrodes are arranged in a first direction and electrically connected to each other via a plurality of first connectors and the output electrodes are arranged in a second direction crossing the first direction and electrically connected to each other via a plurality of second connectors.

According to at least one embodiment, since the surface of the upper substrate where the touch electrode layer is not formed is exposed to the external environment, it is possible to reduce the thickness of the upper substrate via etching or the like, thereby reducing the thickness of the display device.

Further, since the effect of a voltage applied to the pixels is blocked by the shield layer, a parasitic capacitance generated due to this effect is substantially prevented or minimized, and as a result, it is possible to ensure high signal sensitivity of the touch sensor.

DETAILED DESCRIPTION OF CERTAIN INVENTIVE EMBODIMENTS

Figure 1:
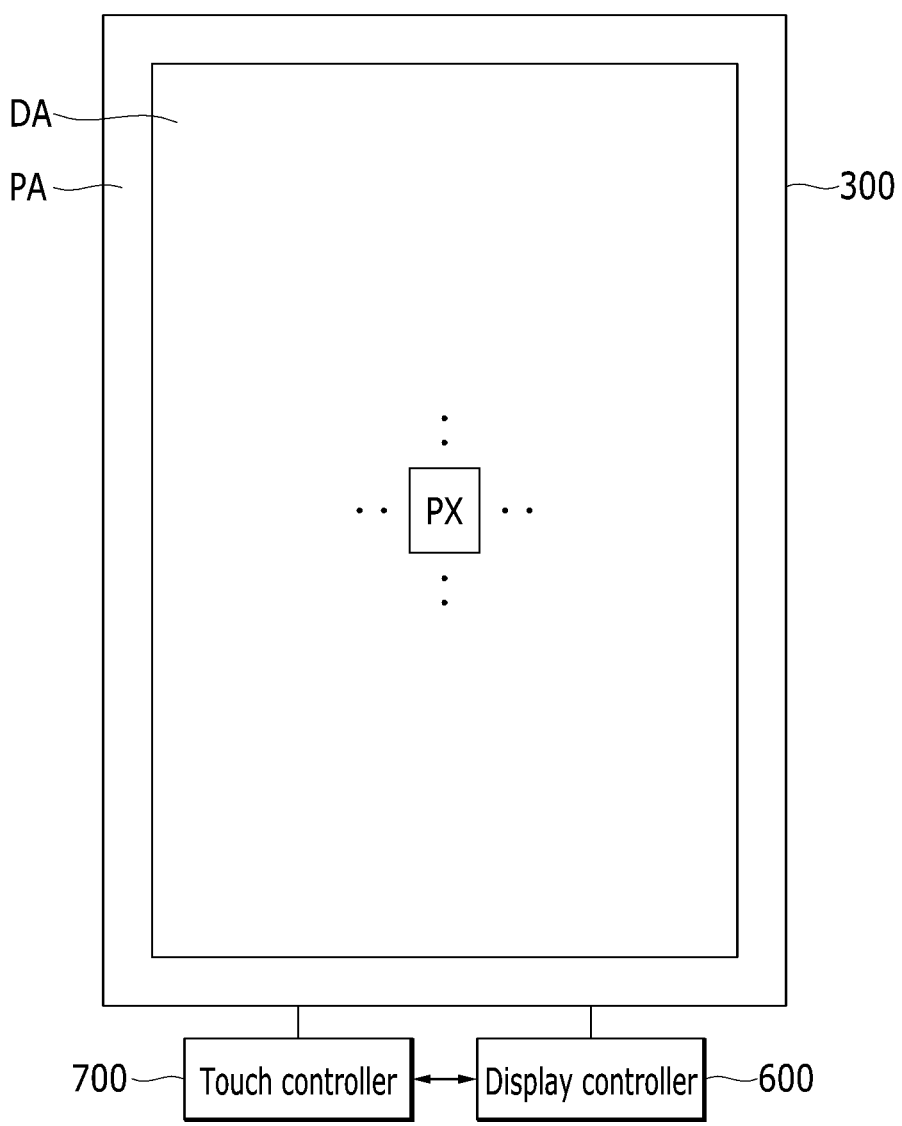
FIG. 1 is a block diagram of a display device according to an exemplary embodiment.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

In the drawings, the thicknesses of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a display device according to an exemplary embodiment of the described technology will be described in detail with reference to the accompanying drawings. Hereinafter, although the described technology is mainly described with reference to an organic light-emitting diode (OLED) display, the described technology may also be applied to other display devices such as a liquid crystal display (LCD), an electrophoretic display (EPD), and a plasma display panel (PDP).

First, a display device including a touch sensor according to an exemplary embodiment will be described with reference to FIGS. 1 to 6.

Referring to FIG. 1, the display device includes a display panel 300, a display controller 600 connected to the display panel 300, and a touch controller 700.

The display panel 300 displays an image and measures touch input. When viewed as a planar structure, the display panel 300 includes a display area DA in which an actual image is displayed and a peripheral area PA surrounding the display area DA.

A partial or entire area of the display panel 300 may be a touch active area TA capable of sensing the touch input. The touch active area TA is an area capable of sensing an object as the touch input when the object actually accesses the touch display panel 300 or contacts the display panel 300. Here, contact includes not only when an external object such as a user's hand directly contacts the display panel 300 but also when the external object is positioned close to the display panel 300 i.e., when the external object hovers over the display panel 300.

Figure 3:
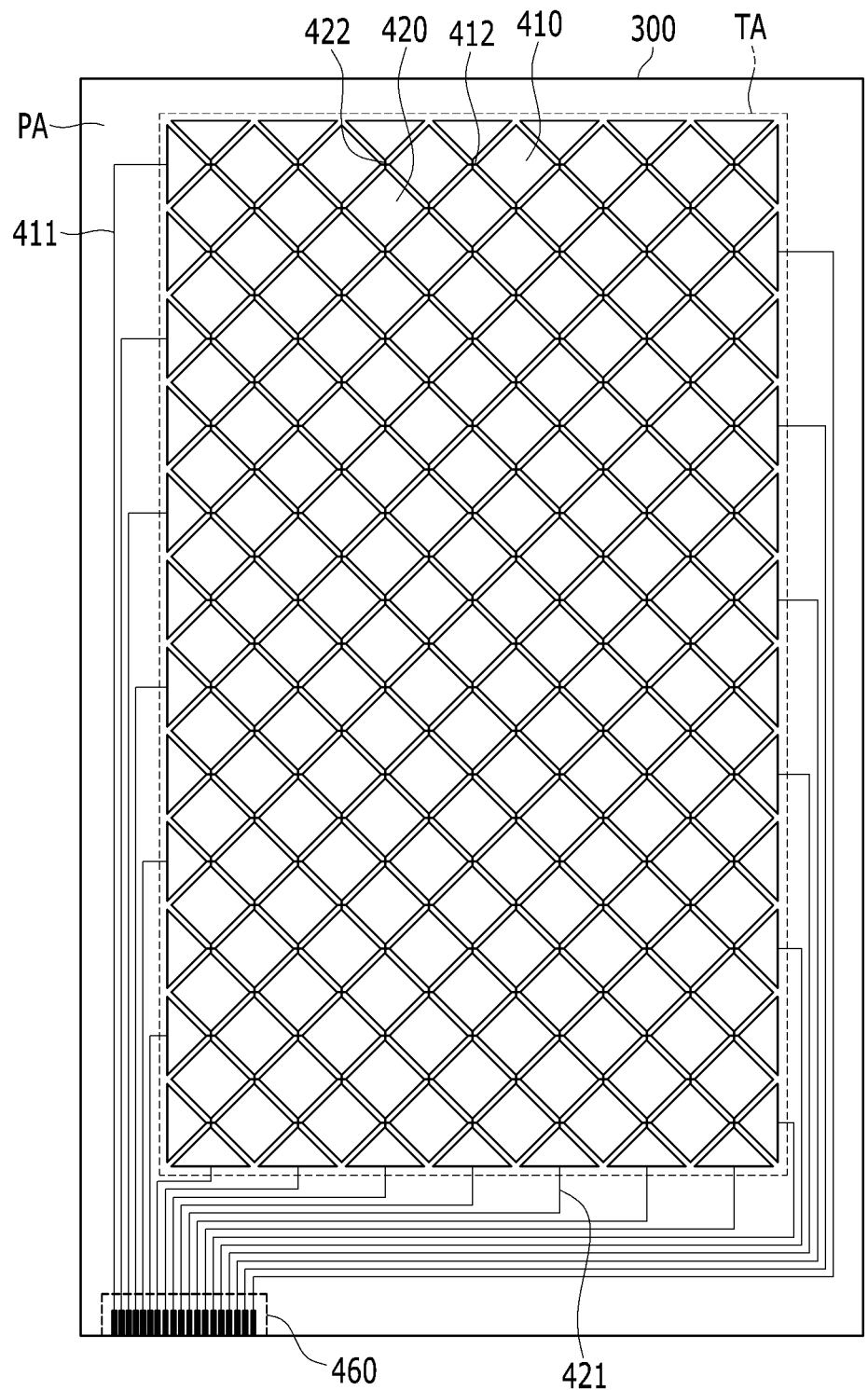
FIG. 3 is a plan view illustrating a touch sensor of the display device according to an exemplary embodiment.

The display area DA and the touch active area TA may substantially coincide with each other as illustrated in FIG. 3, but the described technology is not limited thereto. For example, the touch active area TA may overlap a part of the peripheral area PA and the touch active area TA may also overlap only a part of the display area DA.

Figure 2:
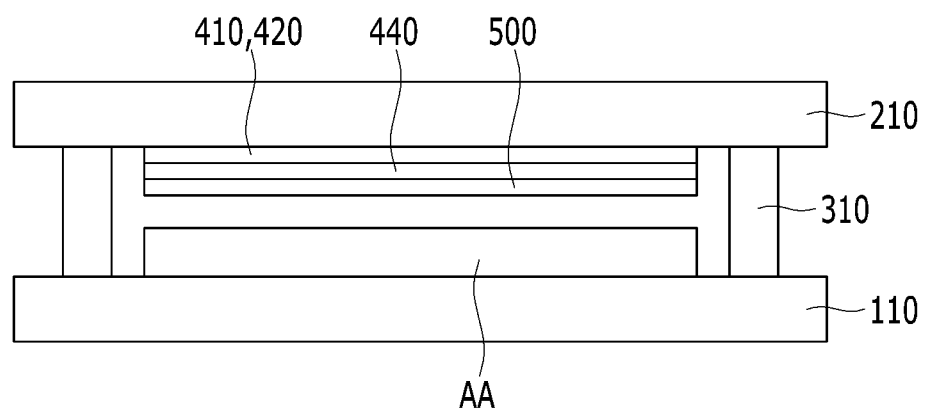
FIG. 2 is a cross-sectional view schematically illustrating the structure of the display device illustrated in FIG. 1.

Referring to FIGS. 1 and 2, the display panel 300 includes a lower substrate 110 and an upper substrate 210 facing each other, an active array AA formed on the lower substrate 110, and a touch sensor formed on the upper substrate 210. Both the active array AA and the touch sensor are formed between the lower substrate 110 and the upper substrate 210 and the peripheral area PA of the lower substrate 110 and the upper substrate 210 is sealed by a sealant 310.

When the display device is an OLED display, the upper substrate 210 functions as an encapsulation substrate.

That is, the upper substrate 210 encapsulates a light-emitting member 370 and a common electrode 270 to be described below to prevent moisture and/or oxygen from penetrating from the external environment. An anti-reflective layer (not illustrated) which may reduce reflection of external light may be formed on a surface where the touch sensor is not formed in the upper substrate 210.

The active array AA on the lower substrate 110 is formed of a transparent insulator such as a glass substrate includes a plurality of pixels and a plurality of display signal lines (not illustrated) which are connected to the pixels to transfer driving signals thereto. The display signal lines are mainly formed in the display area DA.

The display signal lines include a plurality of scanning signal lines or scan lines (not illustrated) transferring scanning signals and a plurality of data lines (not illustrated) transferring data signals. The scanning signal lines and the data lines extend so as to cross each other. The display signal lines extend to the peripheral area PA to form a pad portion (not illustrated).

The plurality of pixels are arranged substantially in a matrix, but the described technology is not limited thereto. Each pixel may include a switching element (not illustrated) connected to the gate line and the data line and a pixel electrode (not illustrated) connected to the switching element. The switching element may be a three-terminal element such as a thin film transistor integrated on the display panel 300. The switching element is turned on or off according to the gate signal received from the gate line to selectively transfer the data signal received from the data line to the pixel electrode. The pixel may further include a pixel electrode and a common electrode (not illustrated) facing the pixel electrode. When the display device is an OLED display, an emission layer is formed between the pixel electrode and the common electrode to form an OLED. The common electrode may apply a common voltage.

In order to implement color in a display, each pixel typically emits one of the primary colors and a desired color is obtained by combining luminances of the colors. An example of primary colors may be three primary colors or four primary colors such as red, green, blue, or the like. Each pixel may further include a color filter formed at a position corresponding to each pixel electrode and filtering light to transmit one of the primary colors. The emission layer included in the OLED typically emits colored light.

The touch sensor formed on the upper substrate 210 is formed of a transparent insulator such as glass and includes a touch electrode layer. The touch electrode layer includes a plurality of touch electrodes 410 and 420. The touch sensor is formed mainly in the touch active area TA.

Since the touch electrode layer is formed on the inner surface of the upper substrate 210, that is, the surface facing the lower substrate 110, when the upper substrate 210 is a glass substrate, the thickness of the upper substrate 210 can be reduced by etching the outer surface of the upper substrate 210.

Different touch sensors measure touch input contact in difference ways. The touch sensor may be classified according to its measurement technology; such touch sensors include resistive, capacitive, electro-magnetic, and optical touch sensors. In the drawings, a capacitive touch sensor will be described as an example.

A shield layer 500 is formed on the touch electrode layer with a second insulating layer 440 therebetween. The shield layer 500 may be formed over the same area as the touch electrode layer, that is, an area corresponding to the area occupied by the touch electrodes 410 and 420. In some embodiments, the shield layer 500 is formed in the touch active area TA. The shield layer 500 substantially isolates the touch sensor from the effect of voltages applied to the display signal lines, the electrodes, and the like, of the active array AA formed on the lower substrate 110. According to an exemplary embodiment, the shield layer 500 is formed on the active array AA of the lower substrate 110.

According to some embodiments, the shield layer 500 is a conductive layer formed of a conductive material. In these embodiment, substantially the same voltage as the driving voltage of the touch sensor is applied to the shield layer 500. That is, the voltage applied to the touch electrode layer is applied to the shield layer 500. For example, a voltage applied to the first touch electrode 410 or a voltage applied to the second touch electrode 420 is applied to the shield layer 500. As a result, it is possible to suppress the generation of a parasitic capacitance due to a potential difference between the touch electrodes 410 and 420 and the pixel electrode or the common electrode.

The sealant 310 is formed in the peripheral area PA where the lower substrate 110 and the upper substrate 210 face each other. The sealant 310 forms a closed loop surrounding the display area DA. The sealant 310 connects the lower substrate 110 to the upper substrate 210 and prevents impurities such as external moisture, oxygen, and the like from penetrating into the space between the lower and upper substrates 110 and 210. Thus, the electro-optical active layer such as the OLED is encapsulated by the lower and upper substrates 110 and 210 and the sealant 310. In these embodiments, the upper substrate 210 functions as n encapsulation substrate and prevents the electro-optical active layer from being exposed to external moisture or oxygen to protect the electro-optical active layer such that characteristics thereof are not changed.

Referring to FIGS. 2 and 3, the touch sensor formed on the upper substrate 210 includes a plurality of touch electrodes 410 and 420. The touch electrodes include a plurality of first touch electrodes 410 and a plurality of second touch electrodes 420. The first and second touch electrodes 410 and 420 are separated from each other.

The first and second touch electrodes 410 and 420 are alternately arranged so as not to overlap with each other in the touch active area TA. The first touch electrodes 410 are arranged in column and row directions and the second touch electrodes 420 are also arranged in column and row directions.

The first and second touch electrodes 410 and 420 are formed on the same layer as each other or different layers from each other. Each of the first and second touch electrodes 410 and 420 may have a substantially diamond shape, but the described technology is not limited thereto and they may have various forms such as protrusions for improving the sensitivity of the touch sensor. According to some embodiments, the first and second touch electrodes 410 and 420 have a surface area that substantially fills the entire layer.

At least some of the first touch electrodes 410 arranged in the same row or column are electrically connected to each other or separated from each other inside or outside the touch active area TA. Similarly, at least some of the second touch electrode 420 arranged in the same column or row are electrically connected to each other or separated from each other inside or outside the touch active area TA. In the embodiment of FIG. 3, the first touch electrodes 410 formed in the same row are electrically connected to each other inside the touch active area TA and the second touch electrodes 420 formed in the same column are electrically connected to each other inside the touch active area TA. In more detail, the first touch electrodes 410 formed in each row are electrically connected to each other via a first connector 412 and the second touch electrodes 420 formed in each column are electrically connected to each other via a second connector 422.

Figure 4:
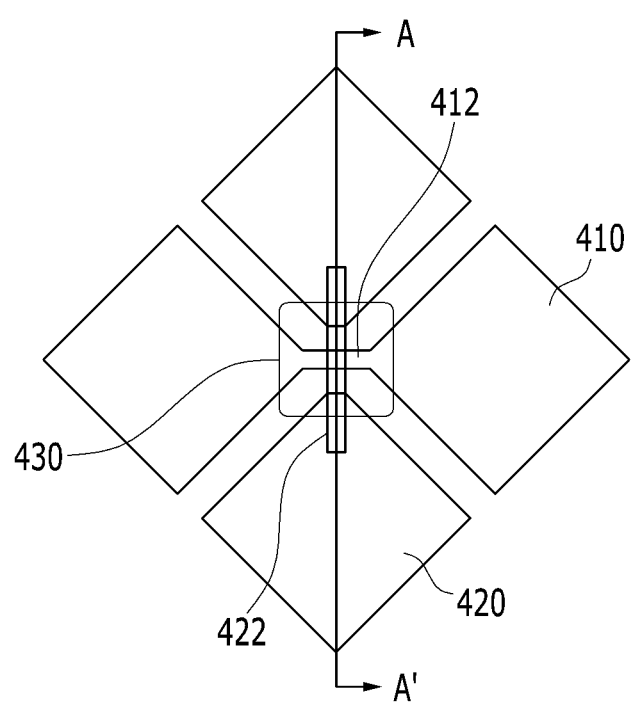
FIG. 4 is an enlarged view of a part of the touch sensor illustrated in FIG. 3.
Figure 5:
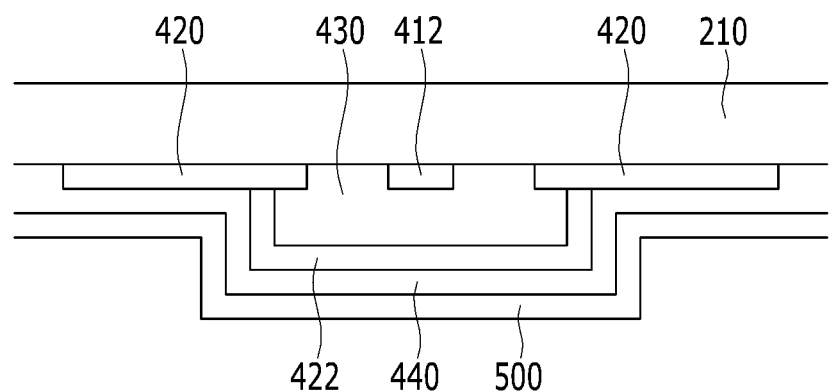
FIG. 5 is a cross-sectional view illustrating a cross section of the touch sensor illustrated in FIG. 4 taken along line A-A' according to an exemplary embodiment.
Figure 6:
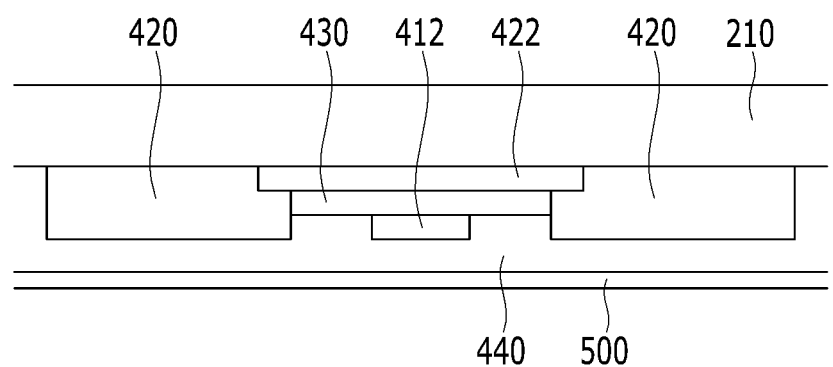
FIG. 6 is a cross-sectional view illustrating a cross section of the touch sensor illustrated in FIG. 4 taken along line A-A' according to another embodiment.

Referring to FIGS. 4 to 6, in some embodiments, the first connector 412 connecting adjacent first touch electrodes 410 is formed on the same layer as the first touch electrodes 410 and is formed of the same material as the first touch electrodes 410. That is, the first touch electrode 410 and the first connector 412 are integrated and simultaneously patterned.

In these embodiments, the second connector 422 connecting adjacent second touch electrodes 420 is formed on a different layer from the second touch electrodes 420. That is, the second touch electrode 420 and the first connector 412 are separated from each other and separately patterned. The second touch electrodes 420 and the second connector 422 are connected to each other through direct contact.

The first insulating layer 430 is formed between the first and second connectors 412 and 422 to electrically insulate the first and second connectors 412 and 422 from each other. According to some embodiments, the first insulating layer 430 is formed as a plurality of independent island-shaped insulators formed at the intersections between the first and second connectors 412 and 422, as illustrated in FIGS. 4 to 6. The first insulating layer 430 exposes at least a part of the second touch electrode 420 so that the second connector 422 can be connected to the second touch electrode 420. The first insulating layer 430 may be formed of SiOx, SiNx, and/or SiOxNy.

The planar structure of the touch electrode layer including the first and second touch electrodes 410 and 420, the first and second connectors 412 and 422, the first insulating layer 430, and the like, in both the exemplary embodiment of FIG. 5 and the exemplary embodiment of FIG. 6 is substantially the same as the planar structure illustrated in FIG. 4. However, FIGS. 5 and 6 exemplify cross-sectional structures of different touch electrode layers.

In the exemplary embodiment of FIG. 5, the second touch electrode 420 and the first connector 412 are formed on the same layer on the upper substrate 210 and the second connector 422 is formed on the second touch electrode 420 and the first connector 412 with the first insulating layer 430 therebetween. In contrast, in FIG. 6, the second connector 422 is formed on the upper substrate 210 and the first insulating layer 430 is formed thereon. The first connector 412 is formed on the first insulating layer 430 so as to overlap with the second connector 422 and to be insulated from the second connector 422. The second touch electrode 420 is connected to the second connector 422 exposed when the first insulating layer 430 is removed.

Meanwhile, as a modified example of the exemplary embodiment of FIG. 5, the first insulating layer 430 is formed below substantially the entire upper substrate 210. Through holes are then formed in the first insulating layer 430 on a part of the second touch electrode 420 for connection such that adjacent second touch electrodes 420 can be electrically connected to each other.

In contrast to the embodiments of FIGS. 4 to 6, the second connector 422 electrically connecting the adjacent second touch electrodes 420 can be formed on the same layer as the first touch electrodes 410 and integrated with the first touch electrodes 410. Thus, the first connector 412 electrically connecting the adjacent first touch electrodes 410 can be formed on a different layer from the first touch electrodes 410.

A second insulating layer 440 is formed over the entire touch active area TA and is formed on the touch electrode layer including the first and second touch electrodes 410 and 420. The second insulating layer 440 may be made of SiOx, SiNx, and/or SiOxNy. A shield layer 500 formed of a transparent conductive material such as indium tin oxide (ITO) or indium zinc oxide (IZO) is formed on the second insulating layer 440. The shield layer 500 may be formed to substantially cover the touch electrode layer. An insulating layer (not illustrated) may be formed on the shield layer 500.

Referring to FIG. 3, the first touch electrodes 410 connected to each other in each row are electrically connected to the touch controller 700 through a first touch wiring 411 and the second touch electrodes 420 connected to each other in each column are electrically connected to the touch controller 700 through a second touch wiring 421. The first and second touch wirings 411 and 421 are illustrates as formed in the peripheral area PA of the display panel 300 as illustrated in the drawing. However, in other embodiments, the first and second touch wirings 411 and 421 are formed in the touch active area TA.

End portions of the first and second touch wirings 411 and 421 form a pad portion 460 in the peripheral area PA of the display panel 300.

The first and second touch electrodes 410 and 420 have a predetermined transmittance or greater so that light from the display panel 300 can be transmitted therethrough. For example, the first and second touch electrodes 410 and 420 may be made of a transparent conductive material, such as indium tin oxide (ITO), indium zinc oxide (IZO), a thin metal layer such as a silver nano wire (AgNW), a metal mesh, and carbon nanotube (CNT), but are not limited thereto. Materials forming the first and second connectors 412 and 422 are the same as the materials of the touch electrodes.

The first and second touch wirings 411 and 421 may include a transparent conductive material such as that forming the first and second touch electrodes 410 and 420, or a low resistive material such as molybdenum (Mo), silver (Ag), titanium (Ti), copper (Cu), aluminum (Al), or molybdenum/aluminum/molybdenum (Mo/Al/Mo).

The first and second touch electrodes 410 and 420 adjacent to each other form a mutual sensing capacitor functioning as the touch sensor. The mutual sensing capacitor receives a sensing input signal through one of the first and second touch electrodes 410 and 420 and outputs a change in stored charge as the sensing output signal due to contact of the external object through the other touch electrode.

In contrast to the embodiments illustrated in FIGS. 2 to 6, each of the first touch electrodes 410 can be separated from each other and each of the second touch electrodes 420 can be separated from each other to form independent touch electrodes. In these embodiments, each touch electrode is electrically connected to the touch controller 700 through separate touch wirings (not illustrated). Each touch electrode forms a self-sensing capacitor as the touch sensor. The self-sensing capacitor receives the sensing input signal to be charged by a predetermined charge and outputs a sensing output signal different from the sensing input signal due to a change in stored charge generated when the external object such as a finger contacts the display device.

Referring back to FIG. 1, the display controller 600 controls an image display operation of the display panel 300. In more detail, the display controller 600 receives an input image signal storing luminance information for each pixel from an external source and an input control signal controlling the display of the input image signal. The display controller 600 processes the input image signal based on the input image signal and the input control signal to convert the input image signal to an output image signal. The display controller 600 generates control signals such as a gate control signal and a data control signal. The signal controller 600 transmits the gate control signal to a gate driver (not illustrated) and transmits the data control signal and the output image signal to a data driver (not illustrated).

Although not illustrated, the data driver receives the output image signal for pixels in one row according to the data control signal and selects a gray voltage corresponding to each output image signal to convert the output image signal into a data voltage and then applies the converted data voltage to the corresponding data line. The gate driver applies a gate-on voltage to the gate line according to the gate control signal to turn on the switching element connected to the gate line. Then, the data voltage applied to the data line is applied to the corresponding pixel through the turned-on switching element. When the data voltage is applied to the pixel, the pixel may display a luminance corresponding to the data voltage through various optical conversion elements such as an OLED.

The touch controller 700 is connected to the touch sensor positioned in the touch active area TA to control an operation of the touch sensor. The touch controller 700 applies the sensing input signal to the touch electrode layer and receives the sensing output signal to process the sensing output signal. The touch controller 700 further applies the same signal as the signal applied to the touch electrode layer (the first touch electrode 410 and/or the second touch electrode 420) to the shield layer 500. The touch controller 700 processes the sensing output signal to generate the touch information such corresponding to the touch input and a touch input position thereof.

The driving devices such as the data driver, the gate driver, and the display controller 600 may be directly mounted on the display panel 300 in at least one IC chip, mounted on a flexible printed circuit board (FPCB) (not illustrated) to be attached to the display panel 300 in a tape carrier package (TCP), or mounted on a separate printed circuit board (not illustrated). Alternately, the driving device may be integrated on the display panel 300 together with the display signal line, the switching element, and the like.

Similarly, the touch controller 700 may be directly mounted on the display panel 300 in at least one IC chip, mounted on the FPCB to be attached to the display panel 300 in the TCP, or mounted on a separate printed circuit board. The touch controller 700 may be connected to the first and second touch wirings 411 and 421 through the pad portion 460 of the display panel 300.

Figure 7:
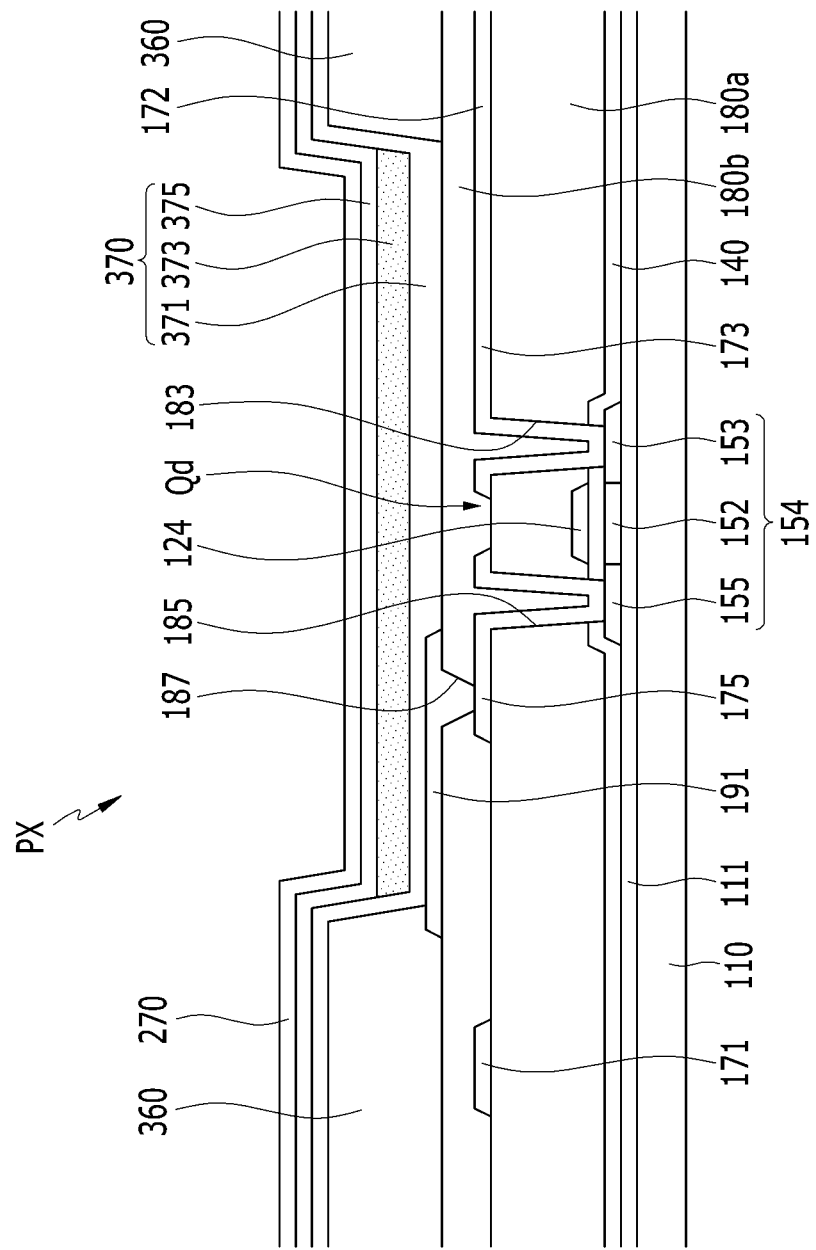
FIG. 7 is a cross-sectional view of one pixel formed at a lower substrate in the display device according to an exemplary embodiment.

FIG. 7 is a cross-sectional view of one pixel formed at a lower substrate in the display device according to an exemplary embodiment.

The display device includes a lower substrate 110 and a plurality of layers formed thereon. A blocking layer 111 may be formed directly on the lower substrate 110.

The lower substrate 110 is formed of a transparent insulating material such as glass or plastic. For example, the lower substrate 110 may be formed of borosilicate glass with a heat-resistance temperature of about 600° C. or greater. The lower substrate 110 may be formed of plastic such as polyethylene terephthalate (PET), polyethylene naphthalate (PEN), or polyimide (PI), or a flexible plastic substrate.

The blocking layer 111 may be formed to prevent impurities, moisture or air, which can damage semiconductors, from penetrating through the lower substrate 110 and planarizes a surface of the lower substrate 110. The blocking layer 111 is also referred to as a barrier layer or a buffer layer. The blocking layer 111 may include silicon nitride (SiNx), silicon oxide (SiOx), silicon oxynitride (SiOxNy), or the like, and may be formed as a single layer or a multilayer. The blocking layer 111 may be omitted based on the type of the lower substrate 110 or a process condition.

A display element including a plurality of thin films is formed on the blocking layer 111. The display element includes signal lines and wirings and the pixels described above. The signal lines may include a plurality of scanning signal lines applying scanning signals and a plurality of data lines applying data signals.

The structure of the display element according to an exemplary embodiment will be described with reference to FIG. 7. A plurality of semiconductor layers 154 are formed on the blocking layer 111. The semiconductor or active layer 154 includes a channel region 152, and a source region 153 and a drain region 155 formed at both sides of the channel region 152 and are formed by doping the semiconductor 154. The semiconductor 154 may include amorphous silicon, polysilicon, or an oxide semiconductor.

A gate insulating layer 140 formed of silicon nitride (SiNx), silicon oxide (SiOx), or the like is formed on the semiconductor 154. The gate insulating layer 140 may be formed as a single layer or a multilayer, and for example, may include a layer made of SiOx, SiNx, and/or SiOxNy.

A plurality of scanning signal lines (not illustrated) and a plurality of gate conductors including a control electrode or gate electrode 124 are formed on the gate insulating layer 140. The control electrode 124 overlaps a part of the semiconductor 154, particularly, the channel region 152.

A first passivation layer 180a is formed on the gate insulating layer 140 and the gate conductor. The first passivation layer 180a and the gate insulating layer 140 include a contact hole 183 exposing the source region 153 of the semiconductor 154 and a contact hole 185 exposing the drain region 155.

A plurality of data conductors including a plurality of data lines 171, a plurality of input electrodes 173 and a plurality of output electrodes 175 are formed on the first passivation layer 180a. The data line 171 applies a data signal and cross the scanning signal line. The input electrode 173 is electrically connected to the data line 171. The output electrode 175 is separated from the data line 171. The input electrode 173 and the output electrode 175 face each other with respect to the semiconductor 154.

The input electrode 173 and the output electrode 175 are respectively electrically connected with the source region 153 and the drain region 155 of the semiconductor 154 through the contact holes 183 and 185.

The control electrode 124, the input electrode 173, and the output electrode 175 form a driving thin film transistor Qd together with the semiconductor 154. However, the structure of the driving thin film transistor Qd is not limited thereto, and may be variously modified.

A second passivation layer 180b formed of an inorganic insulator such as silicon nitride or silicon oxide is formed on the data conductor. The second passivation layer 180b may be formed to have a flat surface by removing steps formed therein, in order to increase light emission efficiency of the OLED to be formed thereon. The second passivation layer 180b includes a contact hole 187 exposing the output electrode 175.

A plurality of pixel electrodes 191 are formed on the second passivation layer 180b. The pixel electrode 191 of each pixel is physically and electrically connected to the output electrode 175 through the contact hole 187 of the second passivation layer 180b. The pixel electrode 191 may include a semi-transmissive conductive material layer or a reflective conductive material.

A pixel defining layer 360 (also referred to a partition wall) having a plurality of openings exposing the pixel electrode 191 is formed on the second passivation layer 180b. The openings in the pixel defining layer 360 exposing the pixel electrode 191 define each pixel area. The pixel defining layer 360 may be omitted.

A light-emitting member 370 is formed in the openings of the pixel defining layer 360 and on the pixel electrode 191. The light-emitting member 370 includes a first organic common layer 371, a plurality of emission layers 373, and a second organic common layer 375 which are sequentially laminated.

The first organic common layer 371 may include at least one of a hole injecting layer (HIL) and a hole transport layer (HTL). When the first organic common layer 371 includes both the hole injecting layer and the hole transport layer, the hole injecting layer and the hole transport layer may be sequentially laminated. The first organic common layer 371 may be formed over the entire display area in which the pixels are formed, and may also be formed only in each pixel area.

The emission layer 373 is formed in the openings in the pixel electrode 191 of each corresponding pixel. The emission layer 373 may be made of an organic material which uniquely emits light of a primary color such as red, green, or blue, and may have a structure in which a plurality of organic material layers emitting light of different colors are laminated.

The second organic common layer 375 may include, for example, at least one of an electron transport layer (ETL) and an electron injecting layer (EIL), and when the second organic common layer 375 includes the electron transport layer and the electron injecting layer, the electron transport layer and the electron injecting layer may be sequentially laminated.

The first and second organic common layers 371 and 375 are layers for improving the light-emitting efficiency of the emission layer 373 and any one of the first and second organic common layers 371 and 375 may be omitted.

A common electrode 270 applying a common voltage is formed on the light-emitting member 370. The common electrode 270 may include a transparent conductive material. For example, the common electrode 270 can be formed of a transparent conductive material such as ITO or IZO, or formed by laminating thin metals including calcium (Ca), barium (Ba), magnesium (Mg), aluminum (Al), silver (Ag), or the like to have a light transmitting property. The common electrode 270 may have a dual-layered structure of a metal layer and a transparent conductive material layer.

The pixel electrode 191, the light-emitting member 370, and the common electrode 270 of each pixel form the emission element and one of the pixel electrode 191 and the common electrode 270 is a cathode and the other electrode is an anode. For example, the pixel electrode 191 may be an anode and the common electrode 270 may be a cathode.

The display device according to the embodiment of FIG. 7 is a top emission type in which light emitted from the light-emitting member 370 is emitted upward to display an image.

An insulating layer (not illustrated) is formed on the common electrode 270. According to at least one embodiment, a shield layer (not illustrated) is formed over the insulating layer positioned on the common electrode 270. In these embodiments, the shield layer 500 is not positioned on the upper substrate 210.

Figure 8:
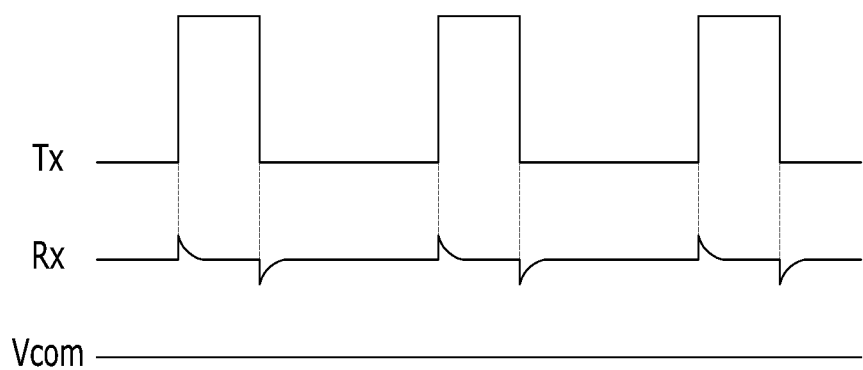
FIG. 8 is a waveform diagram exemplifying a signal applied to the touch sensor according to an exemplary embodiment.
Figure 9:
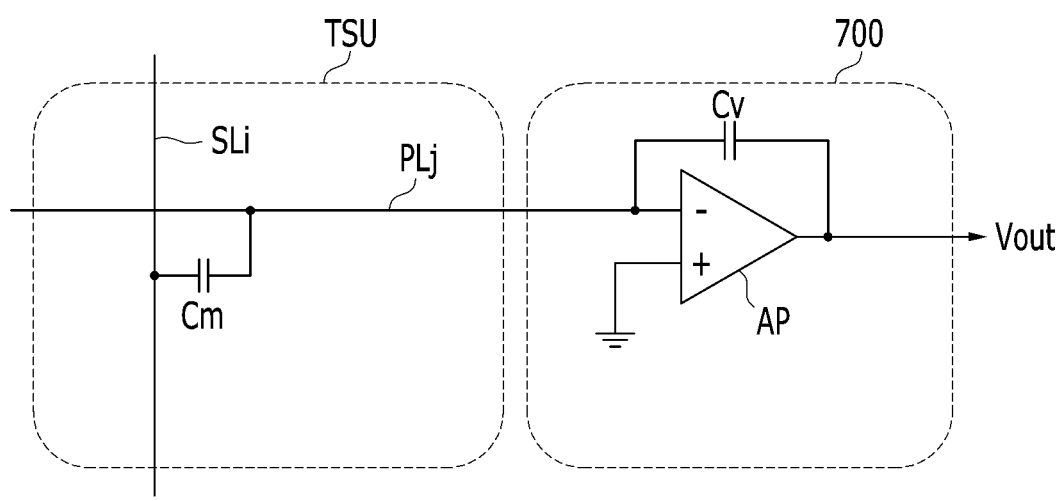
FIG. 9 is a circuit diagram of a touch sensor and a sensing signal processor included in the display device according to an exemplary embodiment.

FIG. 8 is a waveform diagram exemplifying a signal applied to the touch sensor according to an exemplary embodiment. FIG. 9 is a circuit diagram of a touch sensor and a sensing signal processor included in the display device according to an exemplary embodiment.

With references to FIGS. 8 and 2, the first touch electrode 410 may be a sensing input electrode Tx, the second touch electrode 420 may be a sensing output electrode Rx, or the functions of the electrodes can be reversed in some embodiments. A sensing input signal is input to the sensing input electrode Tx. The sensing input signal may have various waveforms and voltage levels, and in the FIG. 8 embodiment, includes pulses which are periodically output and include at least two different voltage levels. A DC voltage is applied to the sensing output electrode Rx. In this embodiment, a square wave which swings from about 0 V to about 3 V is applied to the sensing input electrode Tx and a DC voltage of about 1.5 V is applied to the sensing output electrode Rx. Although the DC voltage is applied to the sensing output electrode Rx, the voltage is changed by capacitive coupling with the swinging sensing input signal. A capacitance due to a potential difference between the sensing input electrode Tx and the sensing output electrode Rx is formed and when the capacitance is changed by the contact of a finger, a touch pen, or the like, with the display device, since the width of the voltage change of the sensing output electrode Rx is changed, the change is measured and thus the touch input can be measured.

Meanwhile, a DC voltage, for example, a voltage of about −3 V is applied to the common electrode Vcom of the pixel. As the touch electrode layer is formed on the inner surface of the upper substrate 210, when the sensing input and output electrodes Tx and Rx and the common electrode Vcom are close to each other, a parasitic capacitance, caused due to the potential difference between the electrodes, may be relatively large. The parasitic capacitance increases a base capacitance of the touch sensor, resulting in a decrease in sensitivity of the touch sensor. According to at least one exemplary embodiment, a shield layer is interposed between the touch electrode layer and the common electrode and substantially the same voltage as the driving voltage of the touch electrode layer is applied to the shield layer, thereby minimizing or removing the parasitic capacitance.

Referring to FIG. 9, an operation of the touch sensor will be described with respect to a circuit. In the FIG. 9 embodiment, one touch sensor unit TSU, which is a combination of one first touch electrode 410 and one second touch electrode 420 illustrated in FIG. 3, includes a sensing capacitor Cm including a sensing input signal line SLi which may be the first touch electrode 410 and a sensing output signal line PLj which may be the second touch electrode 420. The sensing capacitor Cm includes an overlap sensing capacitor formed by the overlapping of the sensing input signal line SLi and the sensing output signal line PLj, or a fringe sensing capacitor in which the sensing input signal line SLi and the sensing output signal line PLj do not overlap with each other and are adjacent to each other.

The touch sensor unit TSU receives the sensing input signal from the sensing input signal line SLi and outputs a change in charge stored in the sensing capacitor Cm due to contact of the external object with the display device as the sensing output signal. In detail, when the sensing input signal is input to the touch sensor unit TSU, the sensing capacitor Cm is charged to a predetermined charge and the stored charge is changed based on the contact. This change in stored charge is output to the sensing output signal line PLj as the sensing output signal. That is, when the external object contacts the display device, the charge stored in the sensing capacitor Cm changes and the sensing output signal is output to the sensing output signal line PLj. The voltage level of the sensing output signal when the object contacts the display panel 300 may be less than the voltage level of the sensing output signal when the object does not contact the display panel 300.

The difference in the sensing output signal between when the object contacts the display panel 300 and when the object does not contact the display panel 300 is substantially proportional to the change in the charge stored in the sensing capacitor Cm. For example, as the charge stored in the sensing capacitor Cm increases, the change in the sensing output signal increases and the sensitivity of the touch sensor unit TSU also increases. Accordingly, the accuracy of the touch input signal increases.

The touch controller 700 receives and processes the sensing output signal to generate the touch input information such as when the touch input has occurred and the touch position of the touch input. To this end, the touch controller 700 includes a plurality of amplifiers AP electrically connected to the sensing output signal line PLj. A capacitor Cv is electrically connected between an inversion terminal (−) and an output terminal of the amplifier AP. A non-inversion terminal (+) of the amplifier AP is connected to a predetermined voltage such as a ground voltage and the inversion terminal (−) of the amplifier AP is connected to the sensing output signal line PLj. The amplifier AP integrates the current of the sensing output signal from the sensing output signal line PLj for a predetermined time (for example, one frame) to generate a sensing signal Vout.

Figure 10:
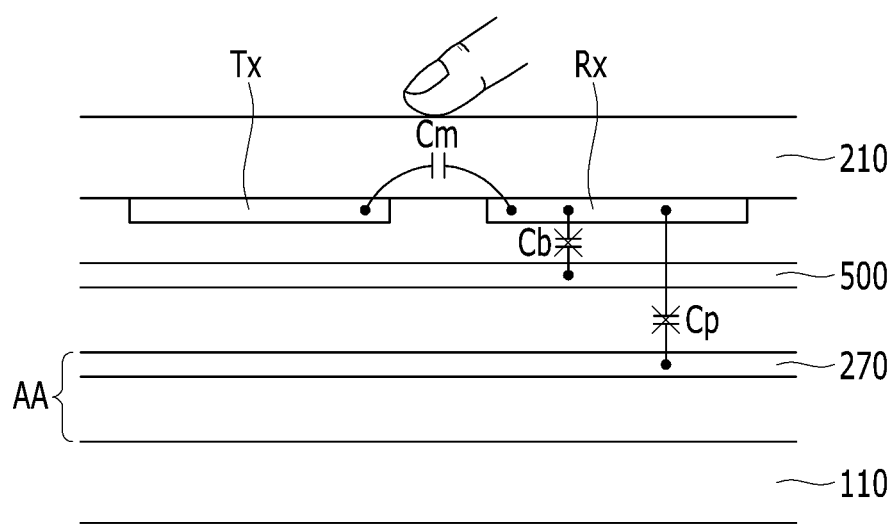
FIG. 10 is a schematic diagram illustrating the capacitance related to the touch sensor of the display device according to an exemplary embodiment.

FIG. 10 is a schematic diagram of a capacitor related to the touch sensor in the display device according to an exemplary embodiment.

The first touch electrode 410 which may be the sensing input electrode Tx and the second touch electrode 420 which may be the sensing output electrode Rx form the sensing capacitor Cm. In the FIG. 10 embodiment, the touch electrode layer including the first and second touch electrodes 410 and 420 is formed on the inner surface of the upper substrate 210 facing the lower substrate 110. Accordingly, the touch electrode layer is positioned very close to the common electrode 270 which may be, for example, a cathode, formed in the active array AA on the lower substrate 110. Since capacitance is inversely proportional to distance, as the touch electrode layer and the common electrode 270 are move closer to each other, the capacitance of the parasitic capacitor Cp configured by the touch electrode layer and the common electrode 270 increases. As a result, a parasitic capacitance between the touch electrode layer and the common electrode 270 is formed with a relatively large value.

As the parasitic capacitance increases, since the base capacitance also increases, sensitivity of the touch sensor decreases. In the embodiment of FIG. 10, the shield layer 500 is interposed between the touch sensor layer and the common electrode 270. As a result, the capacitor Cb may be formed between the touch sensor layer, for example, the sensing output electrode Rx and the shield layer 500. When substantially the same voltage as the voltage applied to the touch electrode layer is applied to the shield layer 500, since a potential difference between the touch electrode layer and the shield layer 500 is not generated, a capacitance between the touch electrode layer and the shield layer 500 is not generated. Further, since the potential difference between the touch sensor layer and the common electrode 270 is shielded by the shield layer 500, the parasitic capacitance between the touch sensor layer and the common electrode 270 is removed. As a result, even though the touch electrode layer is formed on the inner surface of the upper substrate 210 to be very close to the electrode layer of the lower substrate 110, the sensitivity of the touch sensor is substantially maintained.

Since the touch electrode layer includes the sensing input electrode Tx and the sensing output electrode Rx and different voltages are applied to the sensing input electrode Tx and the sensing output electrode Rx, respectively, the voltage applied to the shield layer 500 may be substantially the same as the voltage applied to the sensing input electrode Tx or substantially the same as the voltage applied to the sensing output electrode Rx.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel having a touch active area configured to sense a touch, the display panel comprising:
a lower substrate;
a first electrode disposed over the lower substrate;
an electro-optical active layer disposed over the first electrode;
a second electrode disposed over the electro-optical active layer;
an upper substrate over the second electrode;
a plurality of first touch electrodes and a plurality of second touch electrodes disposed between the second electrode and the upper substrate and directly in the touch active area, the first and second touch electrodes being configured to sense a touch input, the touch active area being where the first touch electrodes and the second touch electrodes are alternatively arranged with each other; and
a shield layer formed of a conductive material, the shield layer being disposed in the touch active area and between the second electrode and the upper substrate, the shield layer directly overlapping the second electrode in a thickness direction of the display panel; and
a touch controller configured to apply a driving signal to the touch electrodes, receive an output signal from the touch electrodes, generate touch information based on the output signal, and apply a same driving signal to the shield layer and the touch electrodes.

2. The display device of claim 1, further comprising an insulating layer interposed between the shield layer and the touch electrodes.

3. The display device of claim 2, wherein the shield layer is formed of a transparent conductive material.

4. The display device of claim 2, wherein the first electrode is a pixel electrode, and
wherein the second electrode is a common electrode.

5. The display device of claim 4,
wherein either the first or second touch electrodes are sensing input electrodes, and
wherein the other of the first or second touch electrodes are sensing output electrodes.

6. The display device of claim 5, wherein the sensing input electrodes are configured to receive the same driving signal.

7. The display device of claim 5, wherein the sensing output electrodes are configured to receive the same driving signal.

8. The display device of claim 5, wherein the first and second touch electrodes are separated from each other and do not overlap with each other.

9. The display device of claim 8, wherein the first touch electrodes are arranged in a first direction and electrically connected to each other via a plurality of first connectors, and
wherein the second touch electrodes are arranged in a second direction crossing the first direction and electrically connected to each other via a plurality of second connectors.

10. The display device of claim 9, further comprising an insulating layer interposed between the first and second connectors.

11. The display device of claim 10, wherein the first connectors are formed on the same layer as the first touch electrodes, and
wherein the first connectors are integrally formed with the first touch electrodes.

12. The display device of claim 1, wherein the upper substrate is formed at least partially of glass.

13. The display device of claim 12, wherein further comprising a sealant interposed between the lower and upper substrates to connect the lower substrate to the upper substrate.

14. The display device of claim 13, wherein the electro-optical active layer comprises a light-emitting member,
wherein the first electrode is an anode, and
wherein the second electrode is a cathode.

15. A display device comprising:
a display panel having a touch active area configured to sense a touch, the display panel comprising:
   a lower substrate;
   a transistor disposed over the lower substrate;
   a pixel electrode disposed over the lower substrate and electrically connected to the transistor;
   an electro-optical active layer disposed over the pixel electrode;
   a common electrode disposed over the electro-optical active layer;
   an upper substrate over the common electrode;
   a plurality of touch electrodes disposed between the common electrode and the upper substrate and directly in the touch active area, the touch electrodes being configured to sense a touch input and comprising a plurality of first touch electrodes and a plurality of second touch electrodes, one of the first and second touch electrodes being sensing input electrodes, and the other of the first and second touch electrodes being sensing output electrodes, the touch active area being where the first touch electrodes and the second touch electrodes cross each other; and
   a shield layer formed of a conductive material, the shield layer being disposed in the touch active area and between the common electrode and the upper substrate, the shield layer directly overlapping the common electrode in a thickness direction of the display panel; and
a touch controller configured to apply a driving signal to the touch electrodes, receive an output signal from the touch electrodes, generate touch information based on the output signal, and apply a same driving signal to the shield layer and the touch electrodes.

* * * * *